(12) United States Patent
Choi et al.

(10) Patent No.: US 9,913,364 B2
(45) Date of Patent: Mar. 6, 2018

(54) PRINTED CIRCUIT BOARD AND VIBRATION ACTUATOR INCLUDING THE SAME

(71) Applicant: JAHWA electronics Co., Ltd., chungcheongbuk-do (KR)

(72) Inventors: Chun Choi, Chungcheongbuk-do (KR); Soon Koo Shim, Cheungcheongbuk-do (KR); Young Bin Chong, Chungcheongbuk-do (KR); Nam Jin Choi, Chungcheongbuk-do (KR); Won Gook Lee, Chungcheongbuk-do (KR); Min Goo Lee, Chungcheongbuk-do (KR); Kyung Hoon Jo, Chungcheongbuk-do (KR)

(73) Assignee: JAHWA ELECTRONICS CO., LTD., Chungcheongbuk-Do (KR)

( * ) Notice: Subject to any disclaimer, the term of this patent is extended or adjusted under 35 U.S.C. 154(b) by 0 days.

(21) Appl. No.: 15/461,618

(22) Filed: Mar. 17, 2017

(65) Prior Publication Data
US 2018/0042102 A1   Feb. 8, 2018

(30) Foreign Application Priority Data

Aug. 4, 2016   (KR) .................. 10-2016-0099642

(51) Int. Cl.
*H01L 23/48*   (2006.01)
*H05K 1/02*   (2006.01)
(Continued)

(52) U.S. Cl.
CPC ............ *H05K 1/0216* (2013.01); *H05K 1/09* (2013.01); *H05K 1/112* (2013.01)

(58) Field of Classification Search
CPC ......... H05K 1/0216; H05K 1/112; H05K 1/09
(Continued)

(56) References Cited

U.S. PATENT DOCUMENTS 4,777,458 A * 10/1988 Pardini .................... H03H 1/00
                                                          333/112
6,346,863 B2 * 2/2002 Sasaki ..................... H01P 5/185
                                                          333/116
(Continued)

FOREIGN PATENT DOCUMENTS

CN      1188968 A    7/1998
CN    101048033 A   10/2007
(Continued)

OTHER PUBLICATIONS

Office action (Opinion Submission Notification) from KIPO dated Apr. 11, 2017.

*Primary Examiner* — Viet Q Nguyen
(74) *Attorney, Agent, or Firm* — The PL Law Group, PLLC

(57) ABSTRACT

A printed circuit board includes a pad to receive an electric signal from a controller, a plurality of signal lines connected to the pad to transmit the electric signal received at the pad, and a signal transmission unit connected to the signal lines to transmit the electric signal to a coil. The plurality of signal lines are configured to face each other in at least a partial region and/or disposed in a zigzag form in at least a partial region. If the printed circuit board and a vibration actuator including the printed circuit board are used, it is possible to change a high frequency interference region according to a pattern by changing a pattern of the printed circuit board, and to improve receiving efficiency of an antenna by reducing high frequency noise.

10 Claims, 10 Drawing Sheets

(51) Int. Cl.
*H05K 1/11* (2006.01)
*H05K 1/09* (2006.01)

(58) Field of Classification Search
USPC .................................... 257/690, 691, 692
See application file for complete search history.

(56) References Cited

U.S. PATENT DOCUMENTS

| | | | | |
|---|---|---|---|---|
| 6,765,455 | B1* | 7/2004 | De Lillo | H01P 5/185 333/116 |
| 7,132,906 | B2* | 11/2006 | Podell | H01P 5/185 333/109 |
| 7,190,240 | B2* | 3/2007 | Podell | H01P 5/185 333/109 |
| 7,245,192 | B2* | 7/2007 | Podell | H01P 5/185 333/112 |
| 7,579,929 | B2* | 8/2009 | Hikino | H01P 1/15 333/128 |
| 9,413,053 | B2* | 8/2016 | Blodt | H01P 5/185 |
| 2007/0165389 | A1* | 7/2007 | Ahn | H01P 5/028 361/767 |

FOREIGN PATENT DOCUMENTS

| | | |
|---|---|---|
| CN | 101171896 A | 4/2008 |
| CN | 103416043 A | 11/2013 |
| CN | 104244574 A | 12/2014 |
| JP | 2001-60746 A | 3/2001 |
| JP | 2012-234992 A | 11/2012 |
| KR | 10-1455722 B1 | 11/2014 |

* cited by examiner

PRINTED CIRCUIT BOARD AND VIBRATION ACTUATOR INCLUDING THE SAME

CROSS-REFERENCE TO RELATED APPLICATION AND CLAIM OF PRIORITY

The present application claims priority to Korean Patent Application KR 10-2016-0099642 filed on Aug. 4, 2016 in the Korea Intellectual Property Office, the disclosures of which are incorporated herein by reference.

TECHNICAL FIELD

The present disclosure relates to a printed circuit board and a vibration actuator including the same, and more particularly, to a printed circuit board capable of changing a high frequency interference region according to a pattern by changing a pattern of the printed circuit board and also capable of improving receiving efficiency of an antenna by reducing high frequency noise, and a vibration actuator including the same.

BACKGROUND ART

Generally, a printed circuit board is called a PCB or a printed-circuit board, on which electric wires for connecting circuit components are expressed as a wiring pattern based on a circuit design and electric conductors are provided on insulating materials in a suitable manner.

In particular, the printed circuit board serves as a base which allows disposition of individual electronic components and also supports them, and also may play a role of electrically connecting the components.

Meanwhile, a linear vibration actuator recently used as a soundless signal receiver of a portable terminal has a short cycle length and gives rapid vibrations at starting or stopping due to an elastic force of an elastic member in comparison to an existing eccentrically rotating vibration actuator, and thus is capable of coping with the slimming trend of a portable terminal.

The linear vibration actuator generally includes a vibrator having a permanent magnet and a stator supporting the vibrator, and the permanent magnet moves vertically to generate vibrations due to an interaction between the electromagnetic force generated by applying a current to a coil disposed at the stator and the magnetism generated from the permanent magnet.

At this time, the printed circuit board described above may be applied so that an electric signal of a controller of a portable terminal may be transmitted to the coil. In particular, the printed circuit board may employ a flexible printed circuit board, namely a flexible printed circuit board (FPCB) and may also be applied to various design conditions by using a board made of an insulating material.

As an example of the printed circuit board, the existing printed circuit board depicted in FIG. 1 may include a pad 10 for receiving an electric signal from a controller of a portable terminal, a signal line 20 for transmitting the electric signal of the pad 10, and a signal transmission unit 30 for transmitting the electric signal to a coil.

However, the receiving efficiency of an antenna installed at the portable terminal or the like may be influenced by the electric signal generated from the printed circuit board. In other words, when the printed circuit board provided at a linear vibration actuator is adjacent to the antenna, the receiving efficiency may be deteriorated due to the high frequency interference generated at the antenna.

Therefore, there is a need to develop a printed circuit board which is capable of changing a high frequency interference region according to a pattern by changing a pattern of the printed circuit board and also capable of improving receiving efficiency of an antenna by reducing high frequency noise, and a vibration actuator including the same.

Embodiments of the present disclosure are directed to changing a high frequency interference region according to a pattern by changing a pattern of the printed circuit board.

Also, the present disclosure is directed to improving receiving efficiency of an antenna by reducing high frequency noise.

In one aspect of the present disclosure, there is provided a printed circuit board, comprising: a pad configured to receive an electric signal from a controller; a plurality of signal lines connected to the pad and configured to transmit the electric signal received at the pad; and a signal transmission unit connected to the signal lines and configured to transmit the electric signal to a coil, wherein the plurality of signal lines are configured to face each other in at least a partial region.

The signal transmission unit may be formed by means of welding or soldering.

The signal lines may include a base layer, a copper foil layer provided at one side of the base layer, and a coverlay provided at one side of the copper foil layer.

The plurality of signal lines may include a first signal line and a second signal line.

In a region where the first signal line and the second signal line face each other, the first signal line and the second signal line may face each other while sharing the base layer.

In a region where the first signal line and the second signal line face each other, signal output directions of the first signal line and the second signal line may be opposite to each other.

In a region where the first signal line and the second signal line face each other, signal output directions of the first signal line and the second signal line may be identical to each other.

A pattern area of the first signal line and a pattern area of the second signal line may be different from each other as much as less than 10%.

The printed circuit board according to the present disclosure may further comprise at least one via hole formed by a connection portion between the signal lines and the pad or a connection portion between the signal lines and the signal transmission unit.

The first signal line and the second signal line may be disposed in a zigzag form in at least a partial region.

In another aspect of the present disclosure, there is also provided a printed circuit board, comprising: a pad configured to receive an electric signal from a controller; a plurality of signal lines connected to the pad and configured to transmit the electric signal received at the pad; and a signal transmission unit connected to the signal lines and configured to transmit the electric signal to a coil, wherein the plurality of signal lines are disposed in a zigzag form in at least a partial region.

The plurality of signal lines may be configured to face each other in at least a partial region.

In another aspect of the present disclosure, there is also provided a vibration actuator, comprising the printed circuit board as described above.

Embodiments of the present disclosure may change a high frequency interference region according to a pattern by changing a pattern of the printed circuit board.

Also, it is possible to improve receiving efficiency of an antenna by reducing high frequency noise.

DETAILED DESCRIPTION

Hereinafter, preferred embodiments of the present disclosure will be described in detail with reference to the accompanying drawings. However, the present disclosure is not limited to the embodiments explained herein but may be materialized into other embodiments. Rather, the embodiments introduced herein are just provided for better understanding to those skilled in the art so that their disclosures can be thoroughly and perfectly understood. In the specification, like references denote like components.

Figure 2:
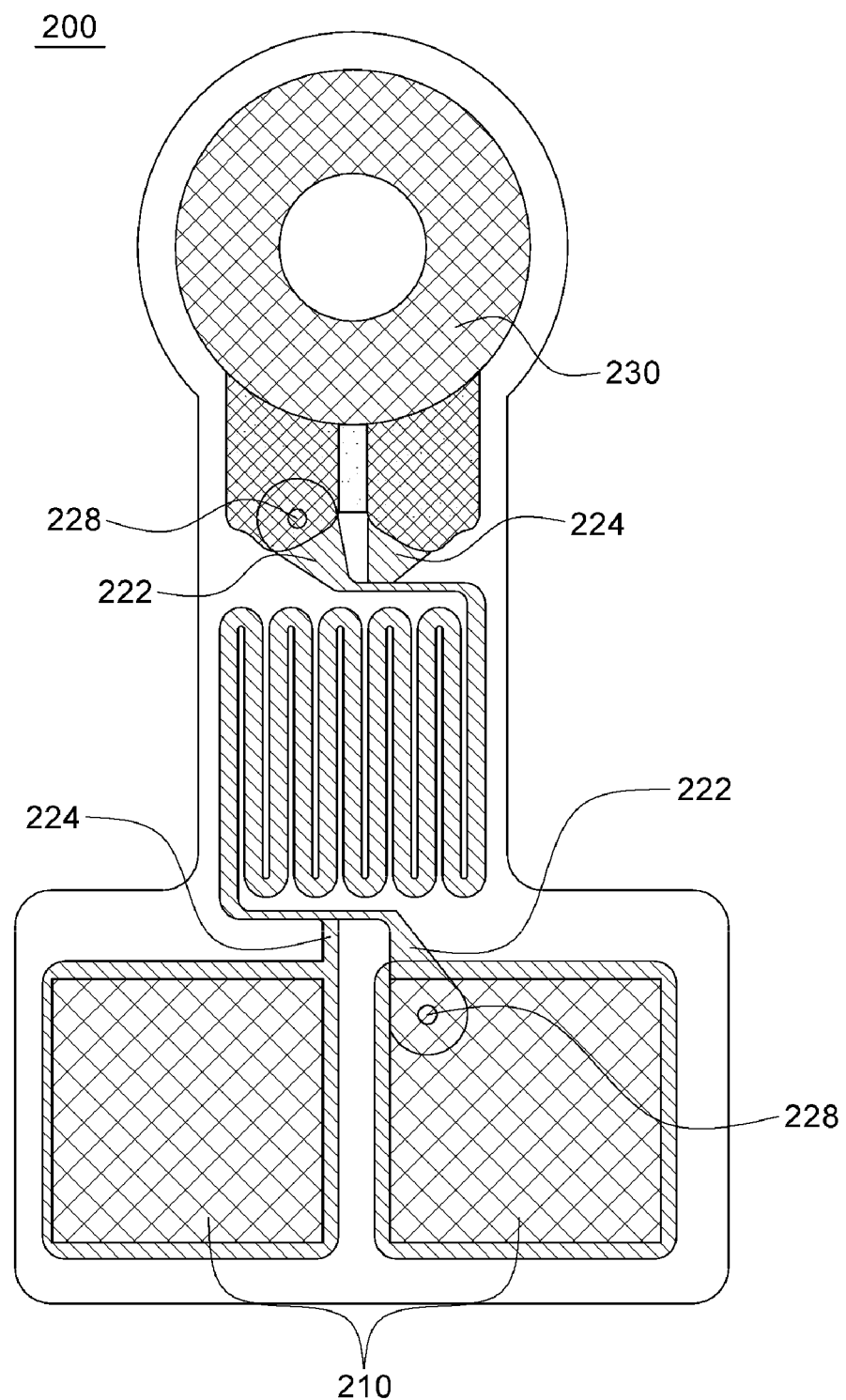
FIG. 2 is a plane view showing a printed circuit board according to an embodiment of the present disclosure.
Figure 3:
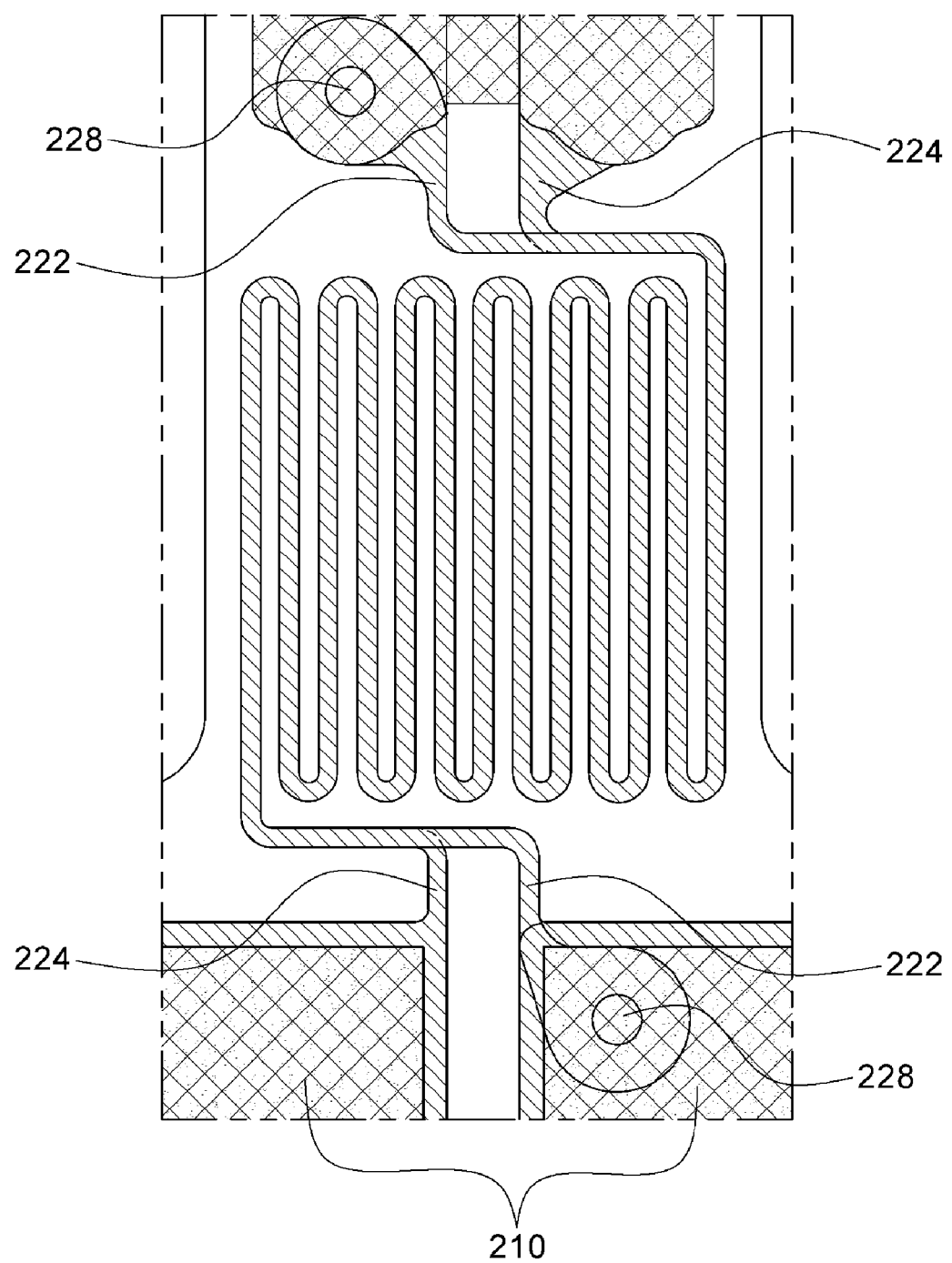
FIG. 3 is an enlarged plane view showing signal lines of the printed circuit board of FIG. 2.
Figure 4:
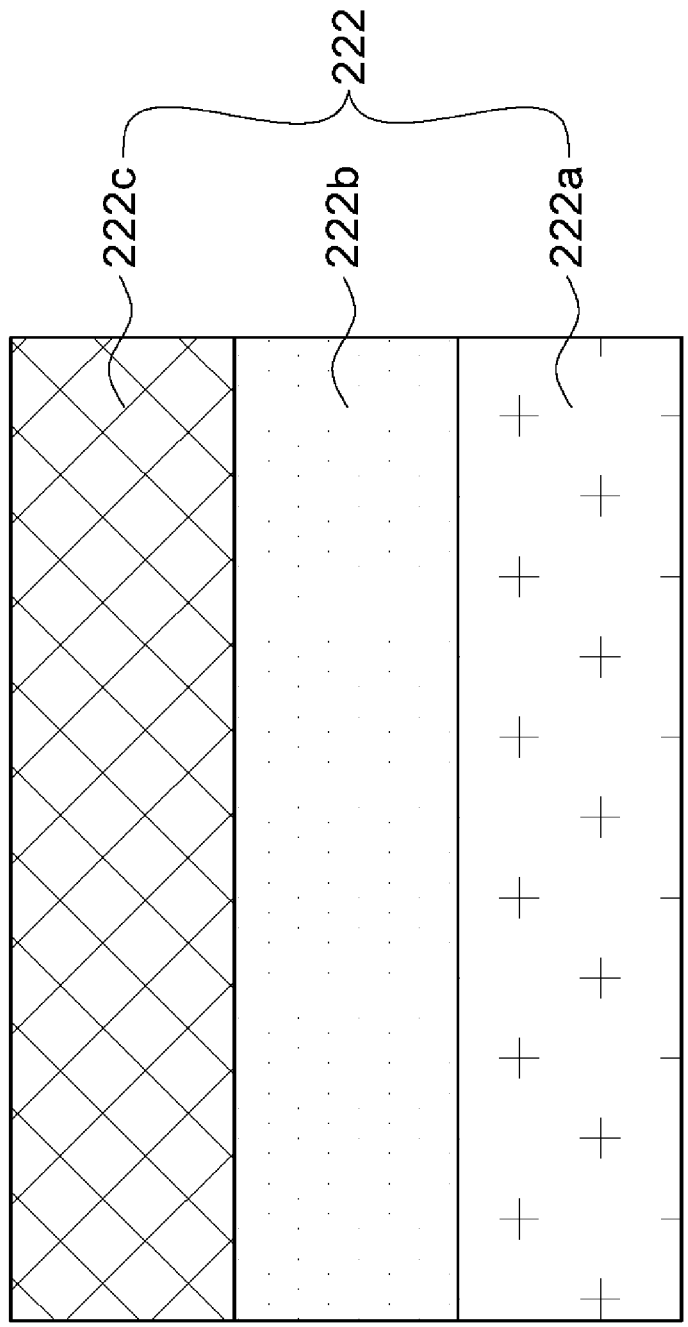
FIG. 4 is a diagram showing a laminated structure of a single signal line.
Figure 5:
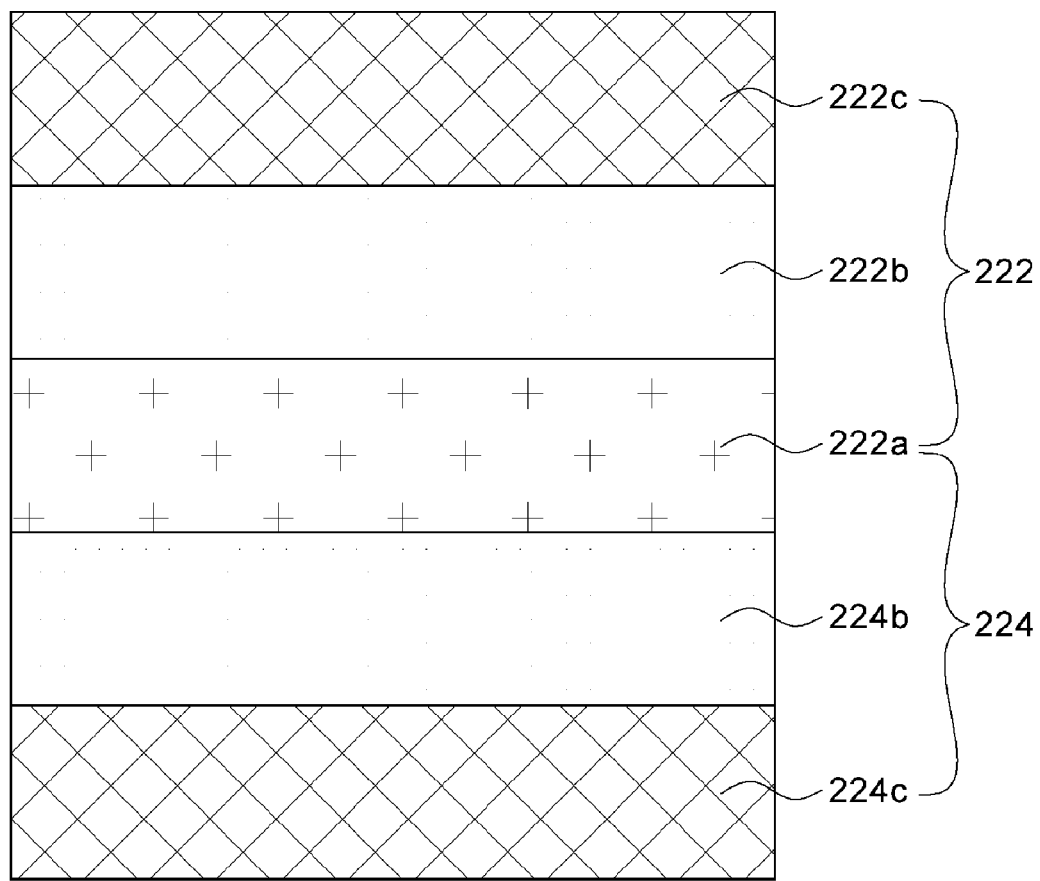
FIG. 5 is a diagram showing a laminated structure where two signal lines face each other.
Figure 6:
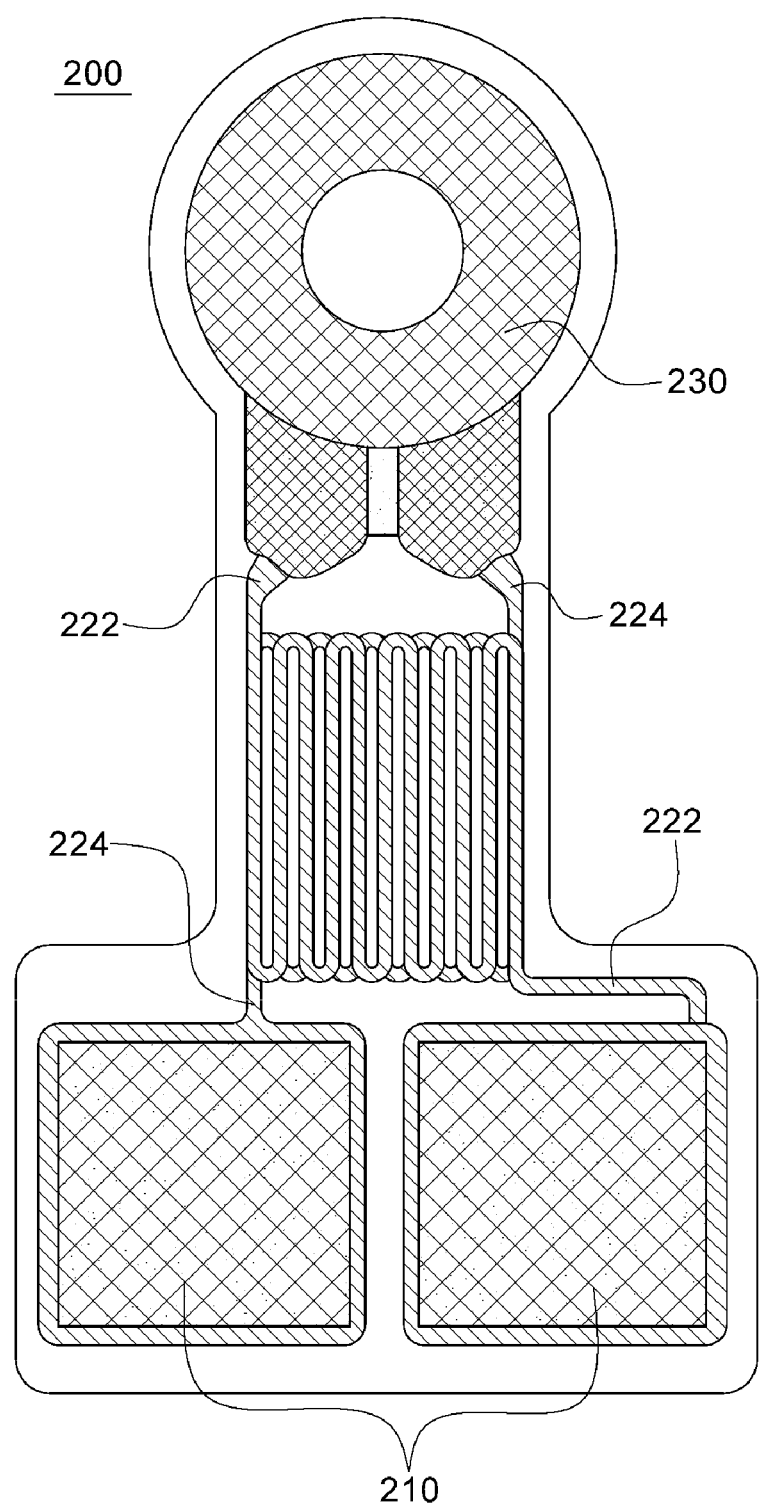
FIG. 6 is a plane view showing a printed circuit board according to another embodiment of the present disclosure.
Figure 7:
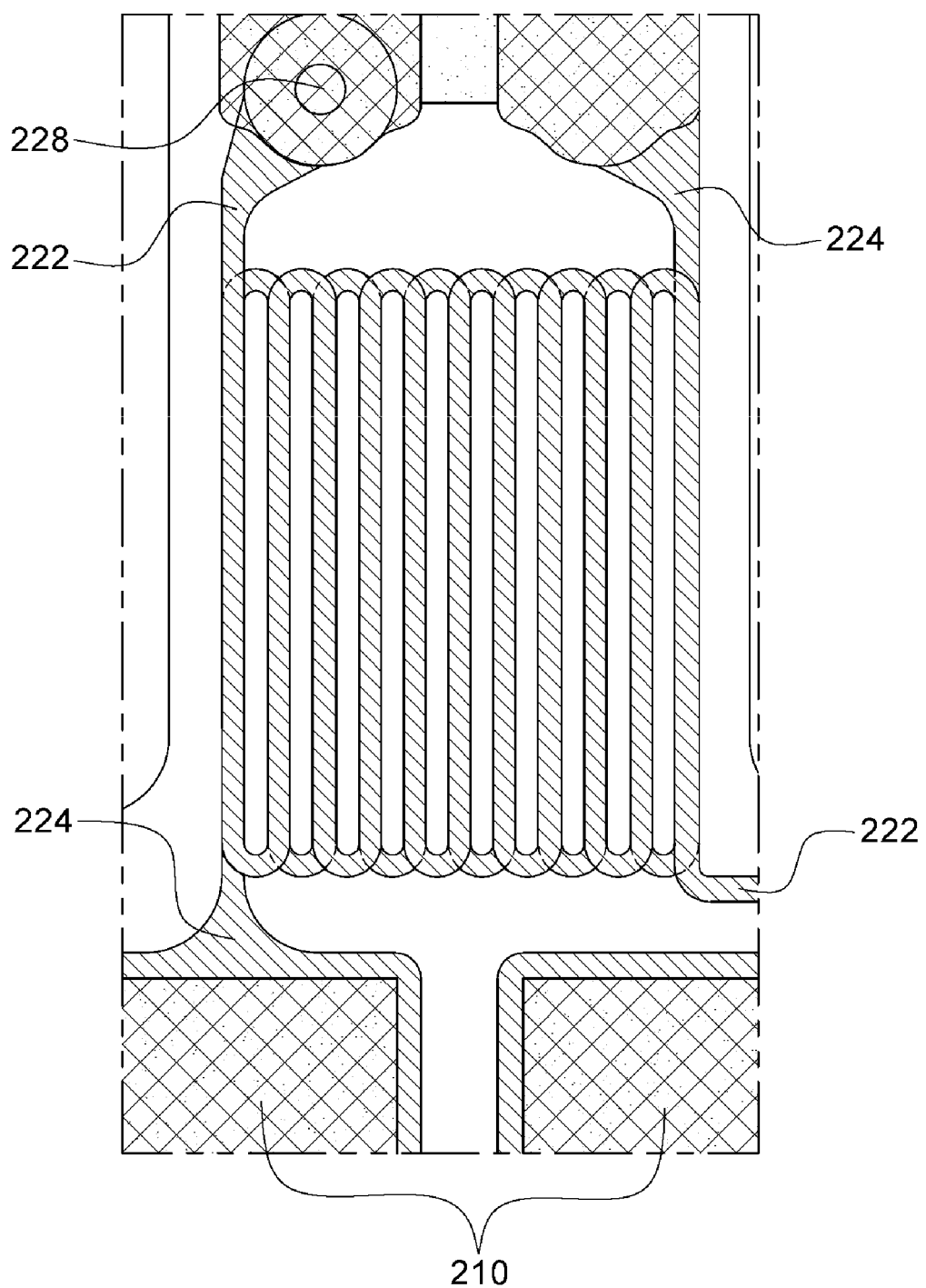
FIG. 7 is an enlarged plane view showing signal lines of the printed circuit board of FIG. 6.
Figure 8:
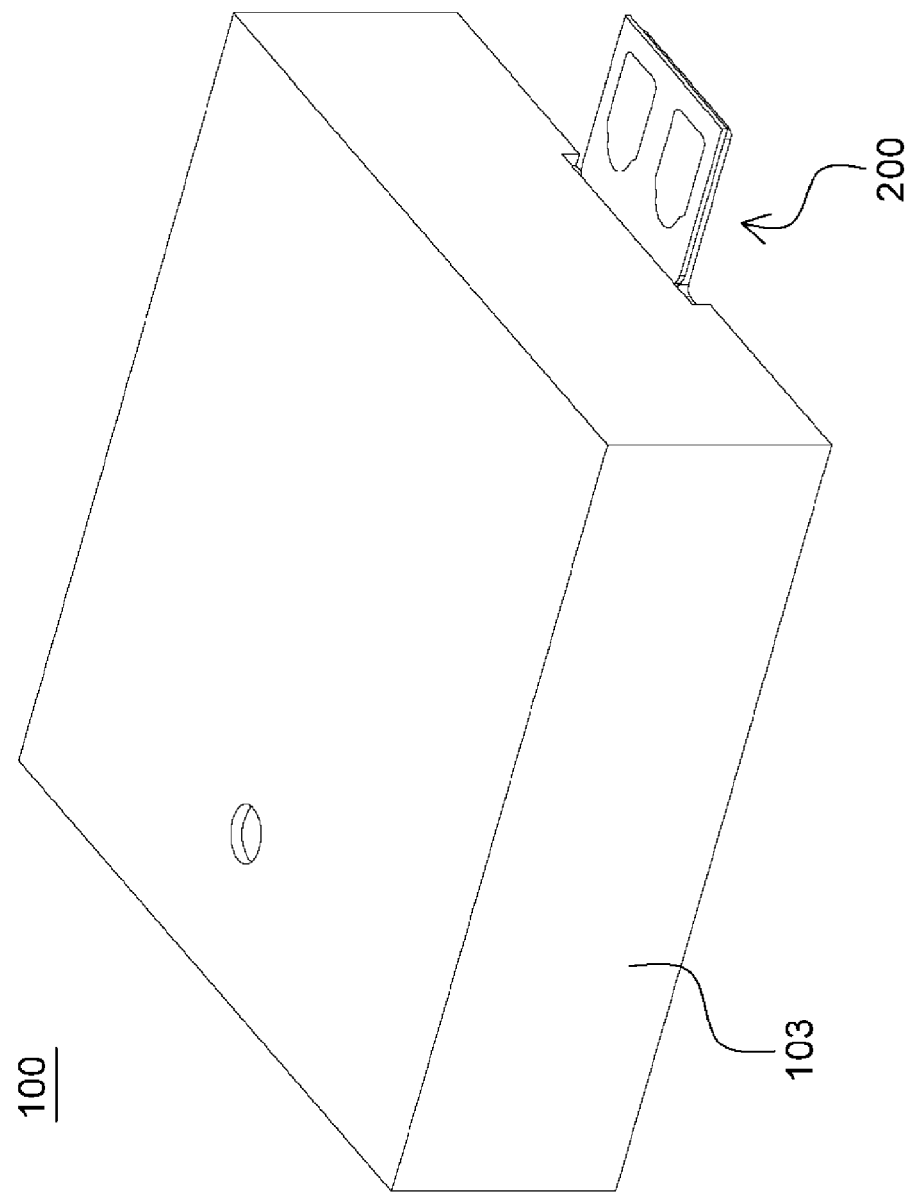
FIG. 8 is a perspective view showing a vibration actuator employed at the printed circuit board according to an embodiment of the present disclosure.
Figure 9:
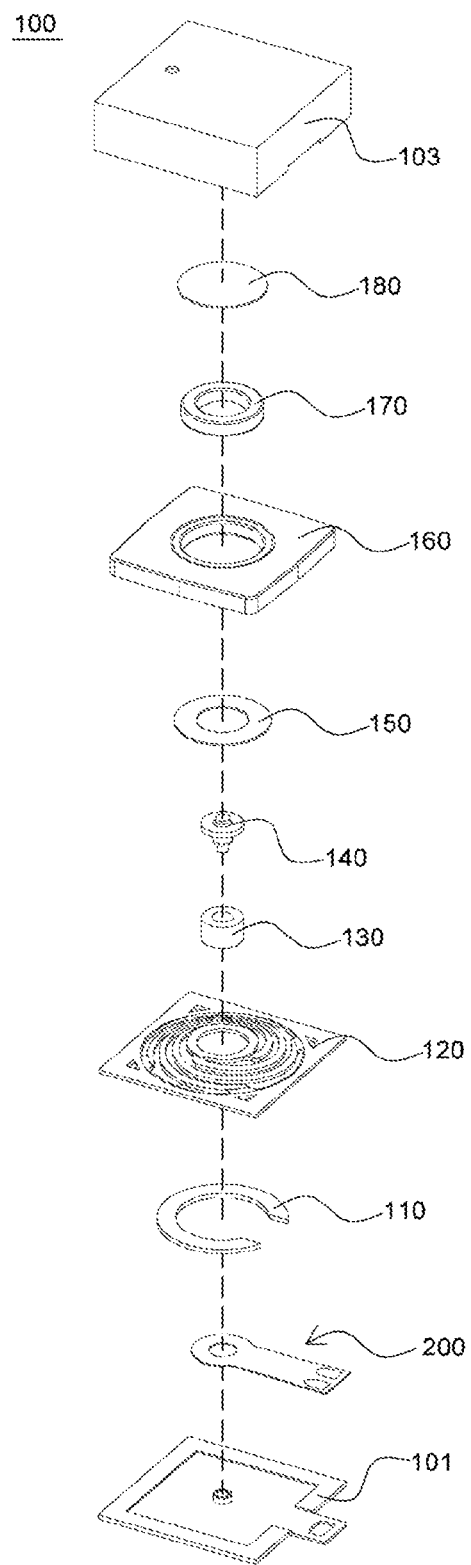
FIG. 9 is an exploded perspective view showing the vibration actuator employed at the printed circuit board according to an embodiment of the present disclosure.
Figure 10:
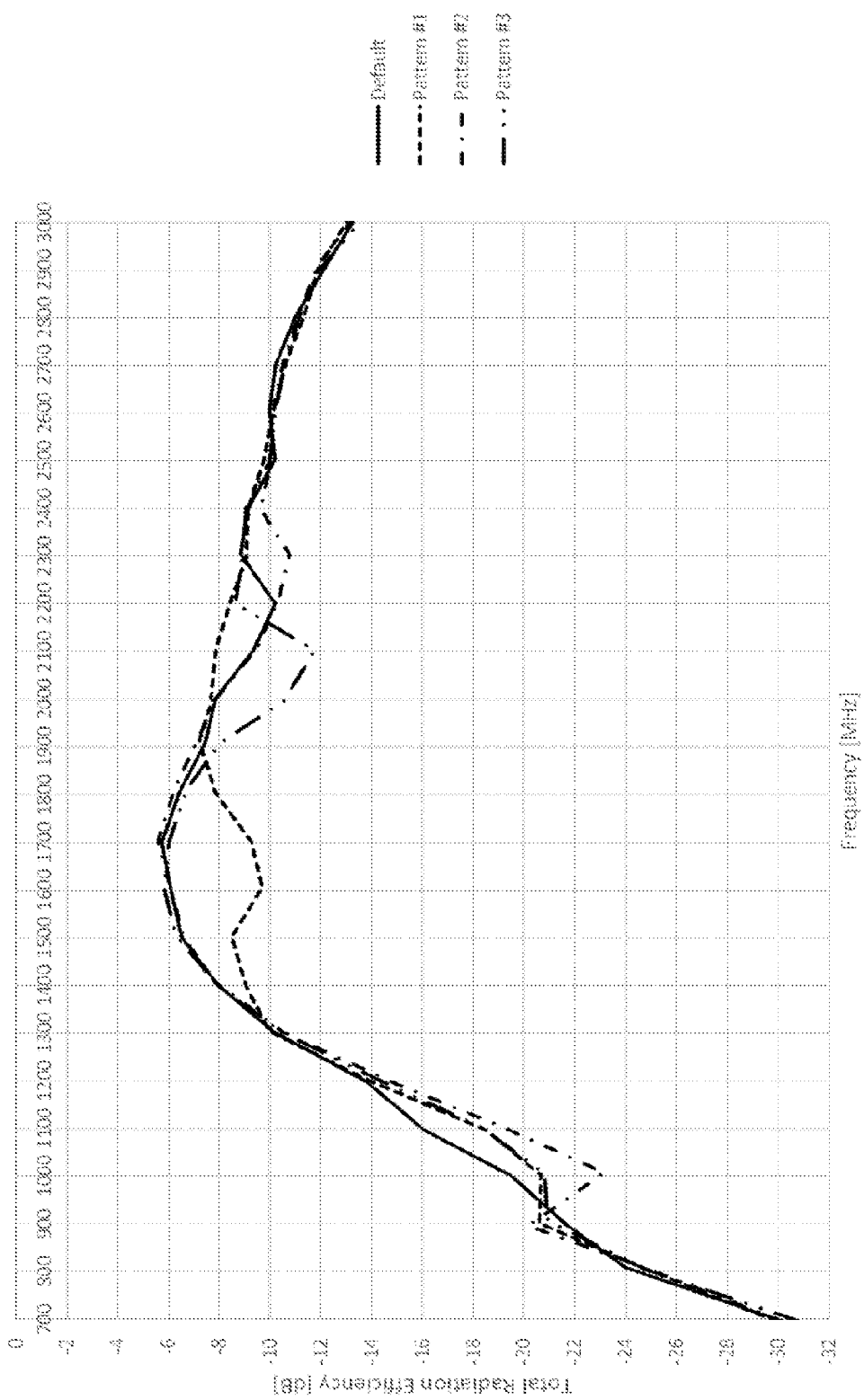
FIG. 10 is a graph comparatively showing receiving efficiency of an antenna according to high frequency interference of the printed circuit board.

FIG. 2 is a plane view showing a printed circuit board according to an embodiment of the present disclosure, FIG. 3 is an enlarged plane view showing signal lines of the printed circuit board of FIG. 2, and FIG. 4 is a diagram showing a laminated structure of a single signal line. FIG. 5 is a diagram showing a laminated structure where two signal lines face each other, FIG. 6 is a plane view showing a printed circuit board according to another embodiment of the present disclosure, and FIG. 7 is an enlarged plane view showing signal lines of the printed circuit board of FIG. 6. FIG. 8 is a perspective view showing a vibration actuator employed at the printed circuit board according to an embodiment of the present disclosure, FIG. 9 is an exploded perspective view showing the vibration actuator employed at the printed circuit board according to an embodiment of the present disclosure, and FIG. 10 is a graph comparatively showing receiving efficiency of an antenna according to high frequency interference of the printed circuit board.

Referring to FIGS. 2 to 10, a printed circuit board 200 according to an embodiment of the present disclosure may include a pad 210 configured to receive an electric signal from a controller (not shown); a plurality of signal lines 222, 224 connected to the pad 210 and configured to transmit the electric signal received at the pad 210; and a signal transmission unit 230 connected to the signal lines 222, 224 and configured to transmit the electric signal to a coil 130.

The pad 210 may be connected to, for example, a controller such as a portable terminal and receive a control signal from the controller. The printed circuit board 200 according to the present disclosure may be applied to any electric device as well as the portable terminal and be configured to receive a control signal from a controller installed at the corresponding electric device.

The pad 210 may be connected to the signal transmission unit 230 through the plurality of signal lines 222, 224, and accordingly the electric signal may be transmitted to the coil 130 connected to the signal transmission unit 230. Therefore, if the printed circuit board 200 according to the present disclosure is installed at a vibration actuator 100 as shown in FIGS. 8 and 9, a permanent magnet 170 may move vertically to generate vibrations due to an interaction between the electromagnetic force generated by applying a current to a coil 130 disposed at a stator and the magnetism generated from the permanent magnet 170.

Here, the signal transmission unit 230 may be formed by welding or soldering.

Meanwhile, the plurality of signal lines 222, 224 for connecting the pad 210 and the signal transmission unit 230 may be formed to have any pattern, and in the printed circuit board 200 according to the present disclosure, the signal lines 222, 224 may be formed to have a zigzag form in at least a partial region.

In other words, as shown in FIGS. 2 and 3, the signal lines 222, 224 may be disposed in a snake form, namely in a zigzag form to connect the pad 210 and the signal transmission unit 230. If the signal lines 222, 224 are arranged in a snake form, the paths of the signal lines 222, 224 are elongated, thereby reducing noise interference to the minimum just by this configuration.

At this time, the signal lines 222, 224 may include a first signal line 222 and a second signal line 224, and both of the first signal line 222 and the second signal line 224 may be disposed in a zigzag form to contact each other in at least a partial region.

In detail, in a region where only the first signal line 222 is present, as shown in FIG. 4, the first signal line 222 may include a base layer 222a, a copper foil layer 222b provided at one side of the base layer 222a, and a coverlay 222c provided at one side of the copper foil layer 222b. In a region where only the second signal line 224 is present, the second signal line 224 may also be configured in this way.

In addition, in a region where the first signal line 222 and the second signal line 224 face each other, as shown in FIG. 5, the first signal line 222 and the second signal line 224 may be configured to face each other while sharing the base layer 222a.

In the embodiment depicted in FIGS. 2 and 3, in the snake-shaped region, the first signal line 222 and the second signal line 224 are closely adhered to each other in a state of facing each other form while sharing the base layer 222a.

In addition, in a region where the pad 210 and the signal transmission unit 230 are connected, the first signal line 222 and the second signal line 224 are separated and respectively connected to the pad 210 and the signal transmission unit 230. At this time, at least one via hole 228 may be formed in a connection portion between the signal lines 222, 224 and the pad 210 or in a connection portion between the signal lines 222, 224 and the signal transmission unit 230. The via hole 228 is a plated hole to give a function of connecting upper and lower patterns to each other without any component mounted thereto.

In the embodiment depicted in FIGS. 2 and 3, the via hole 228 is formed in the portion where the first signal line 222 and the pad 210 are connected and the portion where the first signal line 222 and the signal transmission unit 230 are connected.

Meanwhile, as described above, the receiving efficiency of an antenna (not shown) installed at a portable terminal or the like may be influenced by the electric signal generated from the printed circuit board 200. In other words, when the printed circuit board 200 is adjacent to the antenna, the receiving efficiency may be deteriorated due to the high frequency interference generated at the antenna.

In particular, the high frequency interference tends to increase as the closed loop formed by the signal lines 222, 224 of the printed circuit board 200 has a larger area. However, since the first signal line 222 and the second signal line 224 according to the embodiment depicted in FIGS. 2 and 3 are closely adhered to each other in a state of facing each other in the region having a snake shape, the closed loop formed by the signal lines 222, 224 is reduced, and accordingly the influence by the high frequency interference may be suppressed.

In the embodiment of FIGS. 2 and 3, in the region where the first signal line 222 and the second signal line 224 face each other, a signal input direction of the first signal line 222 is opposite to a signal output direction of the second signal line 224.

In other words, the first signal line 222 and the second signal line 224 of the printed circuit board 200 are patterned along the same path in the region having a snake shape, and thus, even though a current direction is changed when an AC current is applied, the signal input direction and the signal output direction of signals flowing along the first signal line 222 and the second signal line 224 are always opposite to each other.

If the signal input direction and the signal output direction are always opposite to each other in a state where the first signal line 222 and the second signal line 224 face each other, noise may be offset.

In addition, if the first signal line 222 and the second signal line 224 are formed in a snake shape to elongate their paths as described above as in this embodiment, the region where the signal input direction and the signal output direction are opposite to each other in a facing state is also elongated, and thus it is possible to maximize the effect of reducing high frequency interference and noise.

In another embodiment, as shown in FIGS. 6 and 7, in the region where the first signal line 222 and the second signal line 224 face each other, the signal input direction of the first signal line 222 and the signal output direction of the second signal line 224 are identical to each other.

In other words, since the first signal line 222 and the second signal line 224 of the printed circuit board 200 are patterned along opposite paths in the region having a snake shape, even though a current direction is changed when an AC current is applied, the signal input direction and the signal output direction of signals flowing along the first signal line 222 and the second signal line 224 are always identical to each other.

In this case, even though the signal input direction and the signal output direction are identical to each other, since the first signal line 222 and the second signal line 224 face each other, the high frequency interference may be reduced to some degree, and good characteristics may be obtained depending on a frequency band. Thus, this embodiment may be optionally applied.

The printed circuit board 200 according to the present disclosure may be applied to, for example, a vibration actuator 100. As shown in FIGS. 8 and 9, the vibration actuator 100 according to an embodiment of the present disclosure includes a case 103 and a bracket 101 which are coupled to form an accommodation space therein, and the printed circuit board 200 is coupled to an upper surface of the bracket 101. Also, a yoke 140 is provided inside the coil 130 attached to the printed circuit board 200. Here, the case 103, the bracket 101, the printed circuit board 200, the coil 130 and the yoke 140 configure a stator.

In addition, a permanent magnet 170 having a ring shape is disposed at an outer side of the coil 130, and a weight 160 is coupled to an outer circumference of the permanent magnet 170, thereby configuring a vibrator. A first damper 110 and a second damper 180 may be respectively provided at upper and lower portions of the case 103 to relieve impacts caused by vibrations.

An elastic member 120 is interposed between the stator and the vibrator to elastically support vertical movement of the vibrator. At this time, a plate 150 may be provided to connect the vibrator and the elastic member 120. In the vibration actuator 100 configured as above, when an AC current is applied thereto through the printed circuit board 200, the vibrator vibrates vertically.

At this time, since the printed circuit board 200 according to the present disclosure is patterned so that the plurality of signal lines 222, 224 face each other as described above, it is possible to reduce high frequency interference with an antenna installed adjacently and improve the receiving efficiency.

Figure 1:
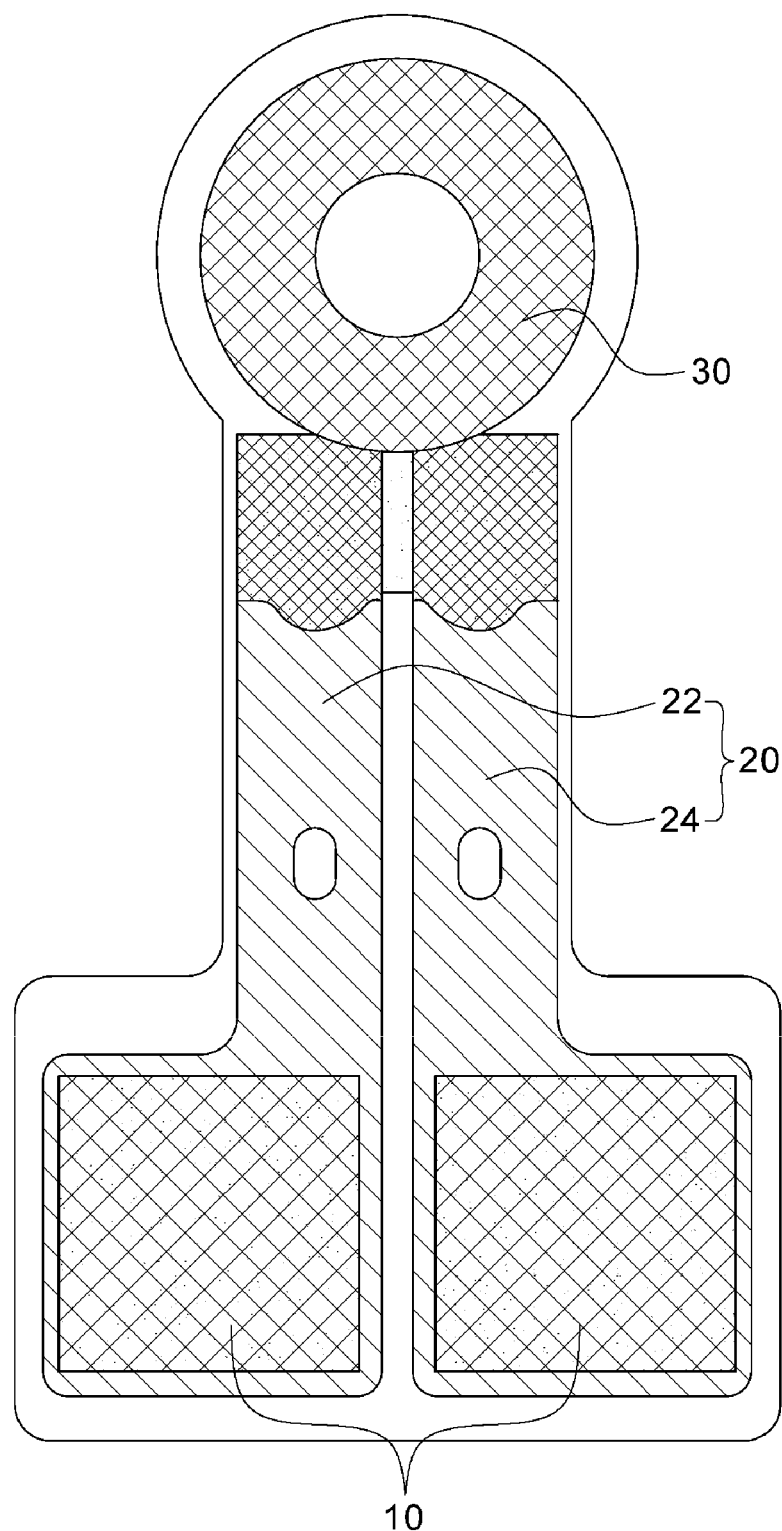
FIG. 1 is a plane view showing a configuration of an existing printed circuit board.

FIG. 10 shows measurement results of the receiving efficiency of an antenna according to a pattern of the printed circuit board. Default represents antenna efficiency when a vibration actuator is not present, and Pattern #1 represents a case where the existing printed circuit board as shown in FIG. 1 is applied. Pattern #2 represents a case where the printed circuit board having a signal line pattern as shown in FIGS. 2 and 3 is applied, and Pattern #3 represents antenna efficiency when the printed circuit board having a signal line pattern as shown in FIGS. 6 and 7 is applied.

Generally, portable terminals normally use frequencies of 1500 MHz to 1600 MHz. In this range, it may be found that the existing printed circuit board of Pattern #1 exhibits very deteriorated antenna efficiency, but Pattern #2 and Pattern #3 according to the embodiments of the present disclosure maintain the antenna efficiency substantially in the same level as Default.

In addition, the antenna efficiency may vary higher or lower depending on frequency bands. Thus, if the pattern of the printed circuit board is changed suitable for each band, the high frequency interference region may be changed to enhance the degree of design freedom.

If the printed circuit board according to the embodiments of the present disclosure as described above is used, it is possible to change a high frequency interference region according to a pattern by changing the pattern of the printed circuit board, and also it is possible to improve the receiving efficiency of an antenna by reducing high frequency noise.

Even though the embodiments of the present disclosure have been described, the present disclosure can be changed and modified in various ways within the scope not departing from the present disclosure defined in the appended claims. Therefore, as long as such modifications include all indispensable components of the present disclosure, they should be regarded as falling into the scope of the present disclosure.

What is claimed is:

1. A printed circuit board, comprising:
a pad configured to receive an electric signal from a controller;
a plurality of signal lines connected to the pad and configured to transmit the electric signal received at the pad; and
a signal transmission unit connected to the signal lines and configured to transmit the electric signal to a coil,
wherein the plurality of signal lines include a first signal line and a second signal line;
the first signal line and the second signal line are disposed in a snake form in at least a partial region;
the first signal line and the second signal line have a region extending by a predetermined length in a state of facing each other in at least a partial region; and
in the region where the first signal line and the second signal line face each other, a signal input direction of the first signal line and a signal output direction of the second signal line are opposite to each other.

2. The printed circuit board of claim 1, wherein the signal transmission unit is formed by means of welding or soldering.

3. The printed circuit board of claim 1, wherein the first signal line and the second signal line include a base layer, a copper foil layer provided at one side of the base layer, and a coverlay provided at one side of the copper foil layer.

4. The printed circuit board of claim 1, wherein in a region where the first signal line and the second signal line face each other, the first signal line and the second signal line face each other while sharing the base layer.

5. The printed circuit board of claim 1, wherein a pattern area of the first signal line and a pattern area of the second signal line are different from each other as much as less than 10%.

6. The printed circuit board of claim 1, further comprising:
at least one via hole formed by a connection portion between the first signal line and the second signal line and the pad or a connection portion between the first signal line and the second signal line and the signal transmission unit.

7. A vibration actuator, comprising the printed circuit board of claim 1.

8. A printed circuit board, comprising:
a pad configured to receive an electric signal from a controller;
a plurality of signal lines connected to the pad and configured to transmit the electric signal received at the pad; and
a signal transmission unit connected to the signal lines and configured to transmit the electric signal to a coil,
wherein the plurality of signal lines include a first signal line and a second signal line;
the first signal line and the second signal line are disposed in a snake form in at least a partial region; and
the region of the snake form is formed to repeatedly have an advancing region of extending by a predetermined length toward the signal transmission unit and a reversing region of extending by a predetermined length to return toward the pad.

9. The printed circuit board of claim 8, wherein the first signal line and the second signal line are configured to face each other in at least a partial region.

10. A vibration actuator, comprising the printed circuit board of claim 8.

* * * * *